US012069969B2

(12) United States Patent
Barends (10) Patent No.: US 12,069,969 B2
(45) Date of Patent: Aug. 20, 2024

(54) REDUCING PARASITIC CAPACITANCE IN A QUBIT SYSTEM (71) Applicant: Google LLC, Mountain View, CA (US)

(72) Inventor: Rami Barends, Goleta, CA (US)

(73) Assignee: Google LLC, Mountain View, CA (US)

(*) Notice: Subject to any disclaimer, the term of this patent is extended or adjusted under 35 U.S.C. 154(b) by 0 days.

(21) Appl. No.: 18/139,288

(22) Filed: Apr. 25, 2023

(65) Prior Publication Data
US 2023/0270021 A1 Aug. 24, 2023

Related U.S. Application Data (63) Continuation of application No. 16/977,673, filed as application No. PCT/US2018/024356 on Mar. 26, 2018, now Pat. No. 11,672,188.

(51) Int. Cl.
H10N 69/00 (2023.01)
G06N 10/00 (2022.01)
H01P 3/00 (2006.01)
H10N 60/12 (2023.01)
H10N 60/85 (2023.01)

(52) U.S. Cl.
CPC ............. H10N 69/00 (2023.02); G06N 10/00 (2019.01); H01P 3/003 (2013.01); H10N 60/12 (2023.02); H10N 60/855 (2023.02)

(58) Field of Classification Search
CPC ........ H10N 69/00; H10N 60/12; G06N 10/00; G06N 10/40
See application file for complete search history.

(56) References Cited

U.S. PATENT DOCUMENTS

| 7,624,088 | B2 | 11/2009 | Johnson et al. |
| 9,647,662 | B1 | 5/2017 | Abutaleb et al. |
| 2004/0184072 | A1 | 9/2004 | Jacobsen et al. |
| 2009/0014714 | A1 | 1/2009 | Koch |
| 2014/0266406 | A1 | 9/2014 | David et al. |
| 2016/0292586 | A1 | 10/2016 | Rigetti et al. |
| 2019/0385673 | A1 | 12/2019 | Bosman et al. |

FOREIGN PATENT DOCUMENTS

| CN | 101375302 | 2/2009 |
| CN | 103582949 | 2/2014 |
| JP | S6147677 | 3/1986 |

(Continued)

OTHER PUBLICATIONS

Barends et al., "Coherent Josephson qubit suitable for scalable quantum integrated circuits," Physical review letters, Aug. 2013, 111(8):080502.

(Continued)

Primary Examiner — Matthew L Reames
(74) Attorney, Agent, or Firm — Fish & Richardson P.C.

(57) ABSTRACT

A system that includes: an array of qubits, each qubit of the array of qubits comprising a first electrode corresponding to a first node and a second electrode corresponding to a second node, wherein, for a first qubit in the array of qubits, the first qubit is positioned relative to a second qubit in the array of qubits such that a charge present on the first qubit induces a same charge on each of the first node of the second qubit and the second node of the second qubit, such that coupling between the first qubit and the second qubit is reduced, and wherein none of the nodes share a common ground is disclosed.

18 Claims, 5 Drawing Sheets

(56) References Cited

FOREIGN PATENT DOCUMENTS

| | | |
|---|---|---|
| JP | 2001-158306 | 6/2001 |
| JP | H141879 | 5/2002 |
| JP | 2003-158306 | 5/2003 |
| JP | 2004-235542 | 8/2004 |
| JP | 2008-525873 | 7/2008 |
| JP | 2008-539480 | 11/2008 |
| JP | 2017-518629 | 7/2017 |
| WO | WO 2006066415 | 6/2006 |
| WO | WO 2015183535 | 12/2015 |
| WO | WO 2017189053 | 12/2016 |
| WO | WO 2017116439 | 7/2017 |

OTHER PUBLICATIONS

Decision to Grant a Patent in Japanese Appln. No. 2020-552037, dated Apr. 18, 2022, 6 pages (with English translation).

Notice of Allowance in Japanese Appln. No. 2022-081650, dated Jun. 19, 2023, 5 pages (with English translation).

Office Action in Canadian Appln. No. 3,093,358, dated Feb. 2, 2022, 5 pages.

Office Action in Canadian Appln. No. 3,093,358, dated Mar. 8, 2023, 6 pages.

Office Action in Japanese Appln. No. 2020-552037, dated Dec. 13, 2021, 7 pages (with English translation).

PCT International Search Report and Written Opinion in International Appln. No. PCT/2018/024356, dated Dec. 20, 2018, 18 pages.

Shaw et al., "Experimental Realization of a differential charge qubit," IEEE transactions on applied superconductivity, Jun. 2007, 17(2):109-112.

Wending et al., "Quantum information processing with superconducting circuits: a review," Reports on Progress in Physics, Sep. 2017, 80(10):106001.

Office Action in Chinese Appln. No. 201880091362.2, mailed on Aug. 31, 2023, 14 pages (with English translation).

Wei, "Surface-Electrode Ion Trap Chip for Scalable Quantum Computing" Dissertation for the Degree of Doctor of Engineering in Electronic Science and Technology, National University of Defense Technology, Oct. 2014, 137 pages (with English abstract).

REDUCING PARASITIC CAPACITANCE IN A QUBIT SYSTEM

CROSS-REFERENCE TO RELATED APPLICATION

This application is a continuation under 35 U.S.C. § 120 and claims the benefit of U.S. application Ser. No. 16/977,673, filed Sep. 2, 2020, which is a National Stage Application under 35 U.S.C. § 371 and claims the benefit of International Application No. PCT/US2018/024356, filed Mar. 26, 2018. The disclosures of the foregoing applications are hereby incorporated by reference in their entirety.

BACKGROUND

Quantum computing is a computing method that takes advantage of quantum effects, such as superposition of basis states and entanglement belonging to separate and remote entities to perform certain computations more efficiently than a classical digital computer. In contrast to a digital computer, which stores and manipulates the information using "bits" configured to be in two bi-stable states (e.g. a "0" and "1"), quantum computing systems aim to manipulate information using "qubits" configured to be the superposition of the quantum states (e.g. $a|0>+b|1>$). Quantum states of each qubit can be entangled with one another, i.e., the measurement result of one qubit is strongly correlated with the measurement result of another qubit. These properties provide a crucial advantage over the classical computer that the speed of a quantum computer is exponential in the number of qubits.

SUMMARY

The present disclosure relates to reducing parasitic capacitance in qubit systems. A quantum computing system may include multiple qubits arranged on a two-dimensional substrate. The multiple qubits can be arranged in the plane of the substrate in any pattern as required for implementing quantum computational algorithms. For example, in some cases, a quantum computing system may include multiple qubits arranged in an array having multiple rows and multiple columns. In order to take advantage of entanglements between the multiple qubits, the system is designed so that there is coupling between certain groupings (e.g. pairs) of qubits. Any given qubit on a planar substrate may be arranged to be coupled to some or all of the rest of the qubits. For example, depending on a design of the quantum computing system, it may be desired that a given qubit is arranged to strongly couple to some of the neighboring qubit and that the coupling between the given qubit and some of its other neighboring qubits are minimized. In certain cases, for example, in a quantum computing system including multiple qubits arranged in an array having multiple rows and columns, these algorithms require coupling between neighboring qubits, e.g., qubits that are nearest together in adjacent rows or adjacent columns of the array. The coupling between the qubits may be facilitated, for example, via co-planar waveguides fabricated on the same substrate. However, due to proximity, undesired parasitic coupling with other qubits in the array, e.g., qubits on the array diagonals, may also occur. These unwanted coupling between adjacent qubits may be mainly capacitive in nature. Such parasitic coupling may prohibit running large-scale quantum computation algorithms with many qubits. if the quantum algorithms for the specific quantum computing system do not take these parasitic coupling into accounts or if the magnitude of these parasitic coupling become non-negligible to the extent that it impedes scaling the quantum computing system into a large number of qubits The present disclosure relates to configurations and arrangements of qubits in arrays that may be used to reduce the capacitive parasitic coupling. In some implementations, each qubit within a qubit array has layout that is the mirror image or flipped layout of a neighboring qubit, such that the parasitic capacitive coupling between the qubits, e.g., two diagonally-located qubits, is reduced or effectively nulled.

In general, an innovative aspect of the subject matter described in this specification can be implemented in a system that includes: an array of qubits, each qubit of the array of qubits comprising a first electrode corresponding to a first node and a second electrode corresponding to a second node, wherein, for a first qubit in the array of qubits, the first qubit is positioned relative to a second qubit in the array of qubits such that a charge present on the first qubit induces a same charge on each of the first node of the second qubit and the second node of the second qubit, such that coupling between the first qubit and the second qubit is reduced, and wherein none of the nodes share a common ground.

The foregoing and other implementations can each optionally include one or more of the following features, alone or in combination. A distance between the first electrode of the first qubit and the first electrode of the second qubit is approximately the same as the distance between the first electrode of the first qubit and the second electrode of the second qubit. The qubits are arranged in a plurality of rows and a plurality of columns and wherein the first qubit is located in a different row and a different column than a row and a column, respectively, in the second qubit is located. The qubits are arranged in a plurality of rows and a plurality of columns and wherein the first qubit is located in a row directly adjacent to a row in which the second qubit is located. The first qubit is located in a column directly adjacent to a column in which the second qubit is located. A capacitance between the first node of the first qubit and the first node of the second qubit is approximately the same as the capacitance between the first node of the first qubit and the second node of the second qubit. Each qubit in the array of qubits is positioned relative to a next nearest neighbor qubit in the array such that a charge present on the qubit induces a same charge on each of the first node of the next nearest neighbor qubit and the second node of the next nearest neighbor qubit such that coupling between the qubit and the next nearest neighbor qubit is reduced. Each qubit in the array of qubits comprises a first junction and a second junction coupled in parallel to one another, each of the first junction and the second junction is coupled both to the first electrode and to the second electrode, and each of the first junction and the second junction is located between the first electrode and the second electrode. The first junction and the second junction are Josephson junctions. Each qubit in the array of qubits comprises a first junction that is coupled both to the first electrode and to the second electrode and that is located between the first electrode and the second electrode. The first junction is a Josephson junction. Each qubit comprises four co-planar waveguide arms, wherein two of the four co-planar waveguides are coupled directly to the first elongated electrode and extend along orthogonal directions, and wherein another two of the four co-planar waveguides are coupled directly to the second elongated electrode and extend along orthogonal directions. Each of the first electrode of the first qubit and the second electrode of the first qubit are parallel to one another along a first direction, wherein the first electrode of the second qubit and the second electrode of the second qubit are parallel to one another along a second direction, and wherein the first direction is orthogonal to the second direction. Each qubit in the array of qubits comprises a differential Xmon qubit. Each qubit in the array of qubits comprises a superconductor thin film that forms the first electrode and the second electrode. The superconductor thin film comprises aluminum, niobium, or titanium nitride. A coupling strength between the first qubit and the second qubit is more than 0 MHz and less than 0.1 MHz for the first qubit tuned to a frequency between about 1 GHz and about 20 GHz. The coupling strength between the first qubit and a qubit that is the nearest from the first qubit is more than 0 MHz and less than 30 MHz for the first qubit tuned to a frequency between about 1 GHz and about 20 GHz. The system further includes: a ground plane, wherein the ground plane is a different plane from a qubit plane in which qubits of the array of qubits are located.

The subject matter described in this specification can be implemented so as to realize one or more of the following advantages. For example, in some implementations, the symmetric configuration and arrangement of qubits within an array reduces or effectively nulls parasitic coupling between qubits. In some implementations, the configuration and arrangement of qubits within the array does not change coupling strength between qubits where coupling is desired. In some implementations, the configuration and arrangement of qubits within the array does not require substantially modifying existing qubit fabrication techniques. In some implementations, the occurrence of ZZ error may be reduced as a result of the configuration and arrangement of qubits within the array.

The details of one or more implementations of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

A qubit system includes an array of multiple qubits, including, e.g., qubits arranged in, for instance, multiple rows and multiple columns. The qubit array may be used to implement quantum computation algorithms. In some implementations, these algorithms may require coupling between neighboring qubits, such as "nearest neighbor" qubits, which include, e.g., qubits that are nearest together in adjacent rows or adjacent columns of a rectangular array of qubits. In these algorithms, it may be required that there is negligible coupling between qubits other than "nearest neighbor" qubits, for example "next nearest neighbor" qubits and between the pairs of qubits which are farther from each other than "nearest neighbor" and "next nearest neighbor" qubits. However, due to proximity, undesired capacitive parasitic coupling may also occur between other qubits within the array, such as between "next nearest neighbor" qubits, which include, e.g., qubits on the array diagonals in a rectangular array of qubits. and this undesired capacitive parasitic coupling may have a non-negligible magnitude to the extent that it affects performing quantum computation algorithms. Such parasitic coupling may be present if it is desired from the system design that some of the neighboring qubits, within a certain distance range where capacitive coupling is non-negligible, are ideally not coupled to one another. Therefore, in such a design, capacitive coupling between qubits are inherently present. Such parasitic coupling may prohibit running large-scale quantum computation algorithms with many qubits. To prevent the parasitic coupling, a particular arrangement of qubits in an array is disclosed. This arrangement reduces or effectively nulls the parasitic coupling using the symmetry configuration and arrangement of the qubits within the array.

Figure 1A:
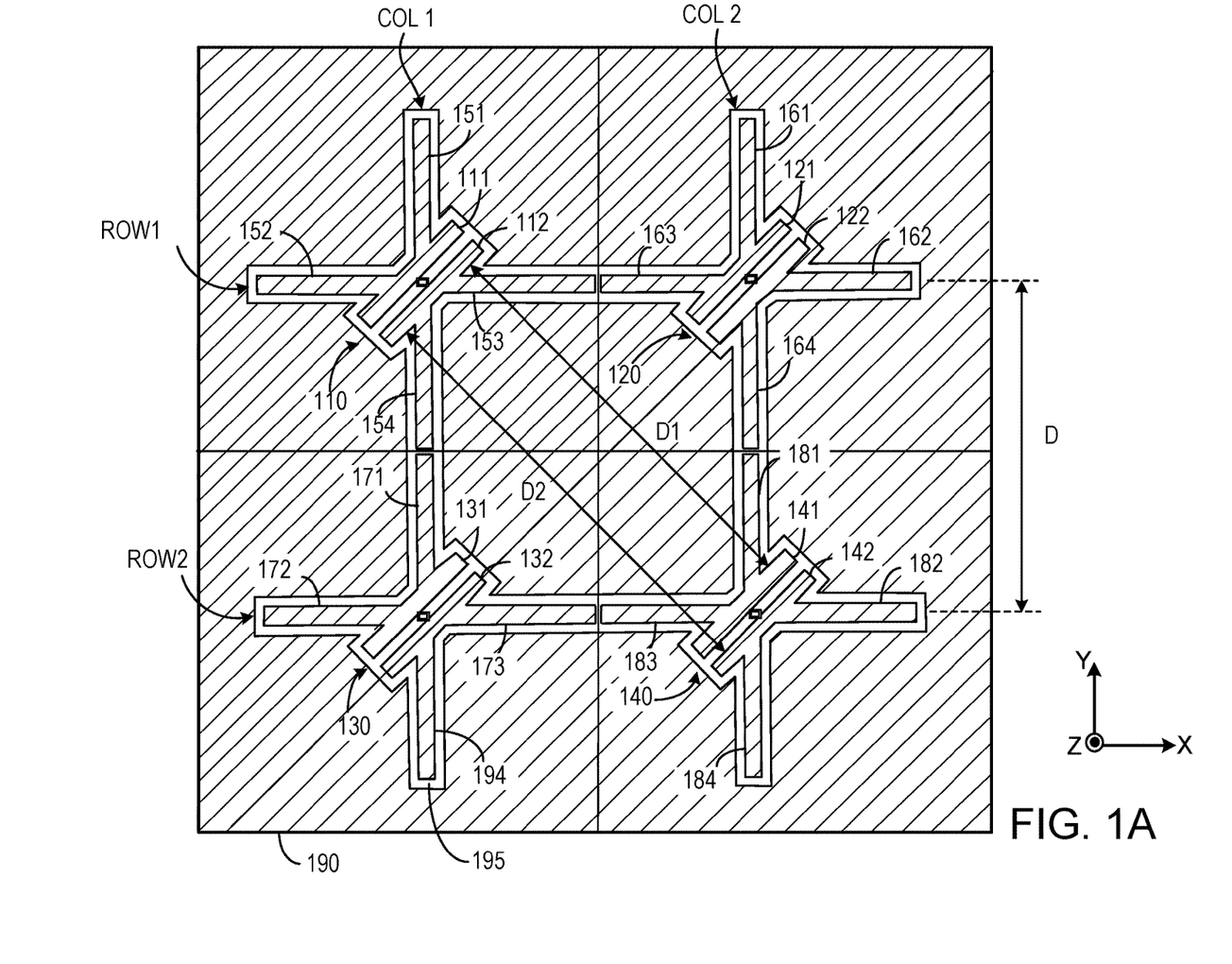
FIG. 1A is a diagram illustrating an example array of qubits for a qubit system.

FIG. 1A illustrates an example array 100 of qubits for a qubit system. The array 100 includes multiple qubits, e.g., qubits 110-140, arranged in multiple rows, e.g., a first row ROW1 and a second row ROW2, and multiple columns, e.g., a first column COL1 and a second column COL2. The numbers of qubits, rows, and columns are not limited to the numbers illustrated in FIG. 1A and can include any suitable numbers of qubits, rows, and columns in various implementations. Similarly, the qubits 110-140 can be any suitable types of qubits including Xmon qubits, transmon qubits, fluxmon qubits, and spin qubits, among others. In some implementations, the qubits 110-140 can be differential qubits. As such, none of the nodes of the qubits 110-140 shares a common ground with another node of any of the qubits.

Each qubit of the qubits 110-140 can include two electrodes arranged in parallel. For example, the first qubit 110 can include a first electrode 111 and a second electrode 112, the second qubit 120 can include a first electrode 121 and a second electrode 122, the third qubit 130 can include a first electrode 131 and a second electrode 132, and the fourth qubit 140 can include a first electrode 141 and a second electrode 142. In this implementation, the second qubit 120 or the third qubit 130 may be identified as the "nearest neighbor" qubit of the first qubit 110. The fourth qubit 140 that is diagonally located from the first qubit 110 may be identified as the "next nearest neighbor" qubit of the first qubit 110. As another example, the first qubit 110 or the fourth qubit 140 may be identified as the "nearest neighbor" qubit of the second qubit 120. The third qubit 130 that is diagonally located from the second qubit 120 may be identified as the "next nearest neighbor" qubit of the second qubit 120.

In some implementations, the qubits 110-140 are not coupled to common ground. That is, electrodes of each qubit of the qubits 110-140 are coupled to different nodes that have respective potential values. For example, the second electrode 112 of the first qubit 110 is coupled to a first node that has a first potential value and the second electrode 142 of the fourth qubit 140 is coupled to a second node rather than the second electrode 112 and the second electrode 142 being coupled to the common ground.

Each qubit includes multiple co-planar waveguide arms (e.g., 151-154, 161-164, 171-174, 181-184) connected to the electrodes and separated from a ground plane 190. These co-planar waveguide arms will be explained in more detail later. In particular, each qubit of the qubits 110-140 can be coupled to four co-planar waveguide arms. For example, the first electrode 111 of the first qubit 110 can be coupled to the co-planar waveguide arms 151, 152 and the second electrode 112 of the first qubit 110 can be coupled to the co-planar waveguide arms 153, 154. In some implementations, the co-planar waveguide arms 151, 152 can extend along orthogonal directions and the co-planar waveguide arms 153, 154 can extend along orthogonal directions. In some other implementations, the co-planar waveguide arms 151, 152 can extend along non-orthogonal directions and the co-planar waveguide arms 153, 154 can extend along non-orthogonal directions.

The second electrode 121 of the second qubit 120 can be coupled to the co-planar waveguide arms 161, 162 and the second electrode 122 of the second qubit 120 can be coupled to the co-planar waveguide arms 163, 164. In some implementations, the co-planar waveguide arms 161, 162 can extend along orthogonal directions and the co-planar waveguide arms 163, 164 can extend along orthogonal directions. In some other implementations, the co-planar waveguide arms 161, 162 can extend along non-orthogonal directions and the co-planar waveguide arms 163, 164 can extend along non-orthogonal directions.

The first electrode 131 of the third qubit 130 can be coupled to the co-planar waveguide arms 171, 172 and the second electrode 132 of the third qubit 130 can be coupled to the co-planar waveguide arms 173, 174. In some implementations, the co-planar waveguide arms 171, 172 can extend along orthogonal directions and the co-planar waveguide arms 173, 174 can extend along orthogonal directions. In some other implementations, the co-planar waveguide arms 171, 172 can extend along non-orthogonal directions and the co-planar waveguide arms 173, 174 can extend along non-orthogonal directions.

The first electrode 141 of the fourth qubit 140 can be coupled to the co-planar waveguide arms 181, 182 and the second electrode 142 of the fourth qubit 140 can be coupled to the co-planar waveguide arms 183, 184. In some implementations, the co-planar waveguide arms 181, 182 can extend along orthogonal directions and the co-planar waveguide arms 183, 184 can extend along orthogonal directions. In some other implementations, the co-planar waveguide arms 181, 182 can extend along non-orthogonal directions and the co-planar waveguide arms 183, 184 can extend along non-orthogonal directions.

In some implementations, the qubits 110-140 of the array 100 may be surrounded by the ground plane 190. The electrodes and co-planar waveguides may be separated from the ground plane 190 by gaps 195 which expose a substrate surface, e.g., a substrate surface on which the electrodes, co-planar waveguides and ground plane are formed. The substrate may include a dielectric substrate such as, e.g., silicon or sapphire. The electrodes, the co-planar waveguides and the ground plane may be formed from a superconductor material that exhibits superconducting properties at temperatures at or below a critical temperature, such as aluminum, niobium, or titanium nitride. Other superconductors may be used as well.

In some other implementations, the qubits and the co-planar waveguides are located in a different plane from a ground plane. For example, where multiple qubits and multiple co-planar waveguide arms are located in a qubit plane, the ground plane can be formed in parallel to the qubit plane. In this implementation, the ground plane can be coupled to the qubit plane through interconnectors, e.g., superconducting interconnectors.

Figure 1B:
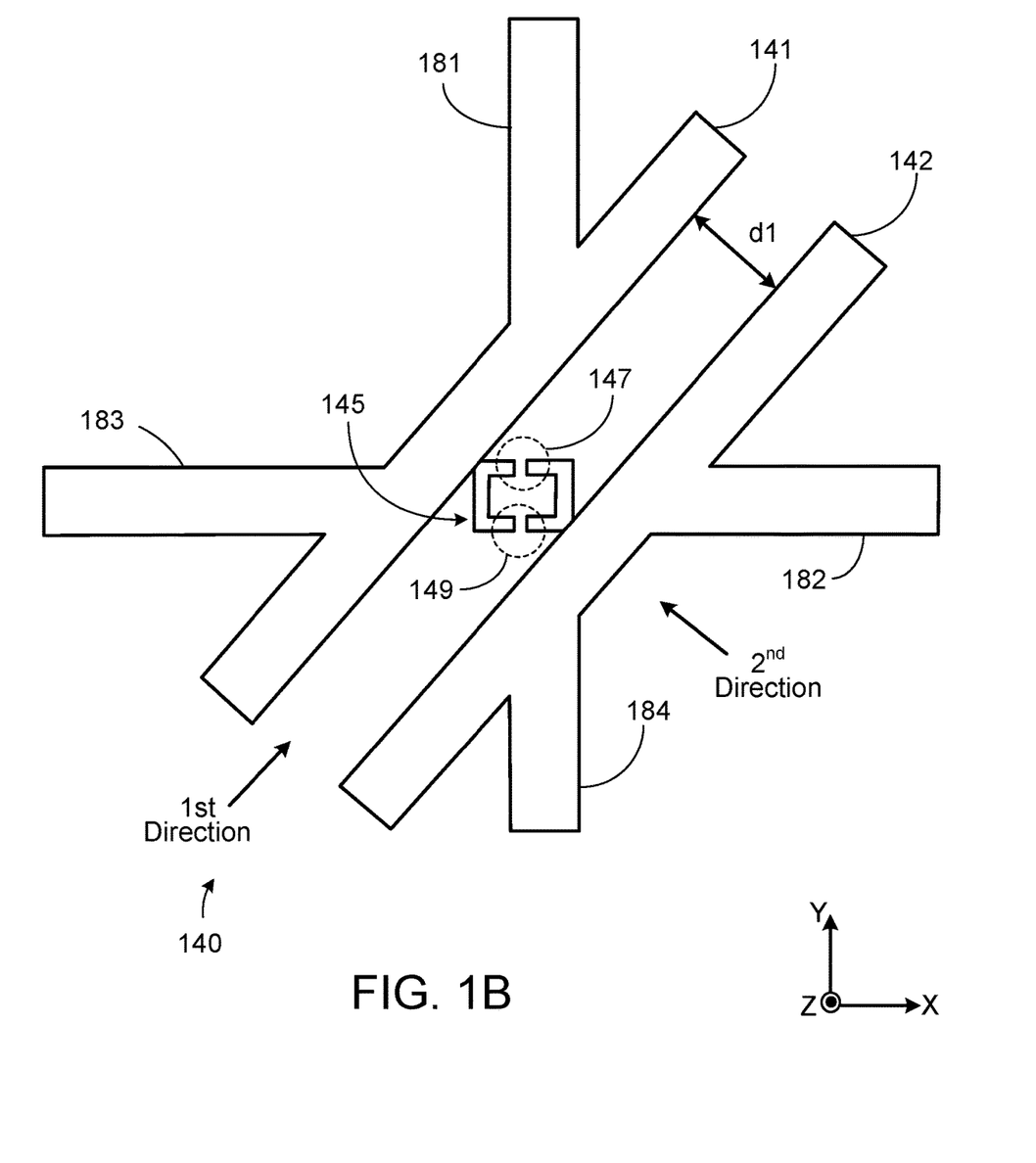
FIG. 1B is a diagram illustrating an example of a superconducting quantum interference device (SQUID) of a qubit in the array described with reference to FIG. 1A.

FIG. 1B illustrates a SQUID 145 of a qubit 140 in the array 100 described with reference to FIG. 1A. For example, the fourth qubit 140 includes the SQUID 145 that is located between the first electrode 141 and the second electrode 142. The SQUID 145 includes a first junction 147 and a second junction 149. Each of the first junction 147 and the second junction 149 is coupled to both the first electrode 141 and the second electrode 142. In some implementations, the junctions 147, 149 can be Josephson junctions.

Referring back to FIG. 1A, during operation of a quantum computational system employing the qubit array 100, the qubit array 100 may be used to implement quantum computation algorithms. In certain cases, these algorithms may require coupling between nearest neighbor qubits, e.g., qubits that are closest together in adjacent rows or adjacent columns of the array, such as coupling between qubit 110 and qubit 120, or between qubit 110 and qubit 130. However, due to proximity, charge present in one qubit may lead to charge induced in another qubit to which coupling is not desired. For example, charge present in qubit 110 may lead to undesired charge in, and thus parasitic capacitive coupling with, a next nearest neighbor qubit on the array diagonals, such as qubit 140. Such parasitic coupling may adversely affect the operation of the algorithm and the quantum computational system as a whole. The parasitic coupling is described in greater detail with reference to FIG. 1C.

In some implementations, two electrodes of one qubit may be floating. That is, different AC voltages can be respectively applied to two electrodes of one qubit. For example, a first AC voltage can be applied to the first electrode 111 and a second AC voltage can be applied to the second electrode 112. In some implementations, the first AC voltage can have a higher magnitude than the second AC voltage. In some implementations, the second AC voltage can have a higher magnitude than the first AC voltage. If different AC voltages are respectively applied to the two electrodes of one qubit, different charges are induced in the two electrodes. This charge difference can be coupled to the differential mode of the qubit. That is, charges induced in an electrode of one qubit can induce charges in electrodes of other qubits. For example, charges in the first electrode 111 of the first qubit 110 can induce charges in the first electrode 121 of the second qubit 120 or in the first electrode 141 of the fourth qubit 140.

Figure 1C:
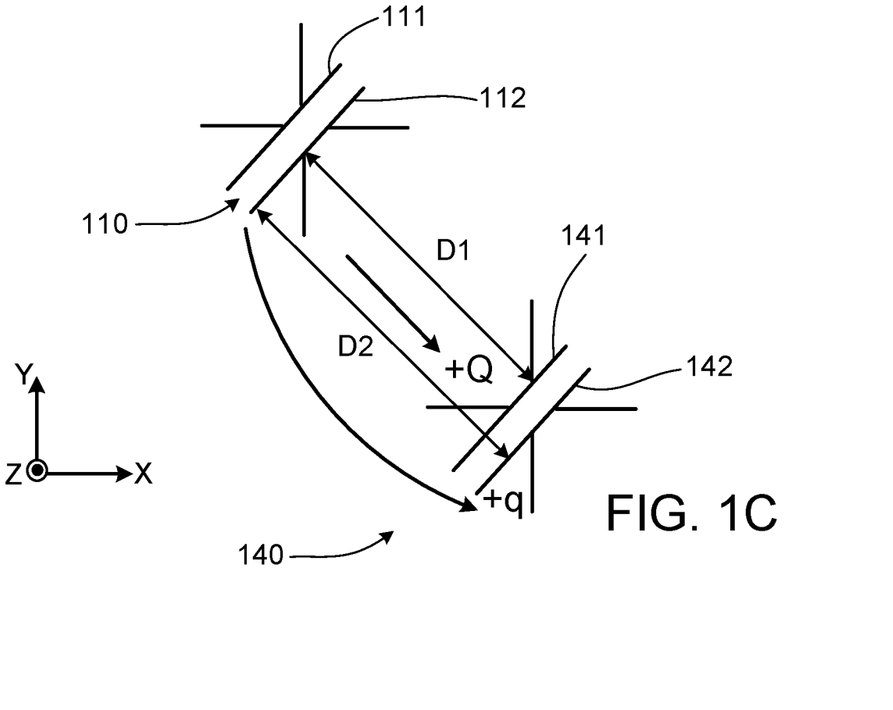
FIG. 1C is a schematic illustrating parasitic capacitive coupling between on-diagonal qubits described with reference to FIG. 1A.

FIG. 1C is a schematic illustrating parasitic capacitive coupling between on-diagonal qubits within an array, such as qubit 110 and qubit 140 of FIG. 1A. As described above, where the qubits 110-140 are not coupled to common ground, when a charge is provided on an electrode (e.g., electrode 112) of the first qubit 110, a corresponding charge is induced in both electrodes (e.g., electrodes 141, 142) of the on-diagonal qubit 140. In particular, since a distance D1 between the second electrode 112 and the first electrode 141 is different from a distance D2 between the second electrode 112 and the second electrode 142, a different amount of charge is induced on each of electrode 141, 142. For example, a larger charge having a greater magnitude ("Q") may be induced on electrode 141, and a smaller charge having a smaller magnitude ("q") may be induced on electrode 142. The coupling between the qubit 110 and the qubit 140 then scales with the charge difference between the induced charges on each of the electrodes within the on-diagonal qubit 140. That is, a first capacitance between the second electrode 112 and the first electrode 141 is different from a second capacitance between the second electrode 112 and the second electrode 142. As a result, a charge in the second electrode 112 induces a charge difference between the first electrode 141 and the second electrode 142. This charge difference is not cancelled by a charge in the first electrode 111 due to the difference in capacitance mentioned above, causing undesired parasitic coupling between the first qubit 110 and the fourth qubit 140. For example, referring back to FIG. 1A, where a distance D between one qubit and its nearest qubit is 600 μm, the parasitic capacitance between the first qubit 110 and the fourth qubit 140 amounts to about 16 aF and the parasitic capacitance between the second qubit 120 and the third qubit 130 amounts to about 13 aF.

Figure 2A:
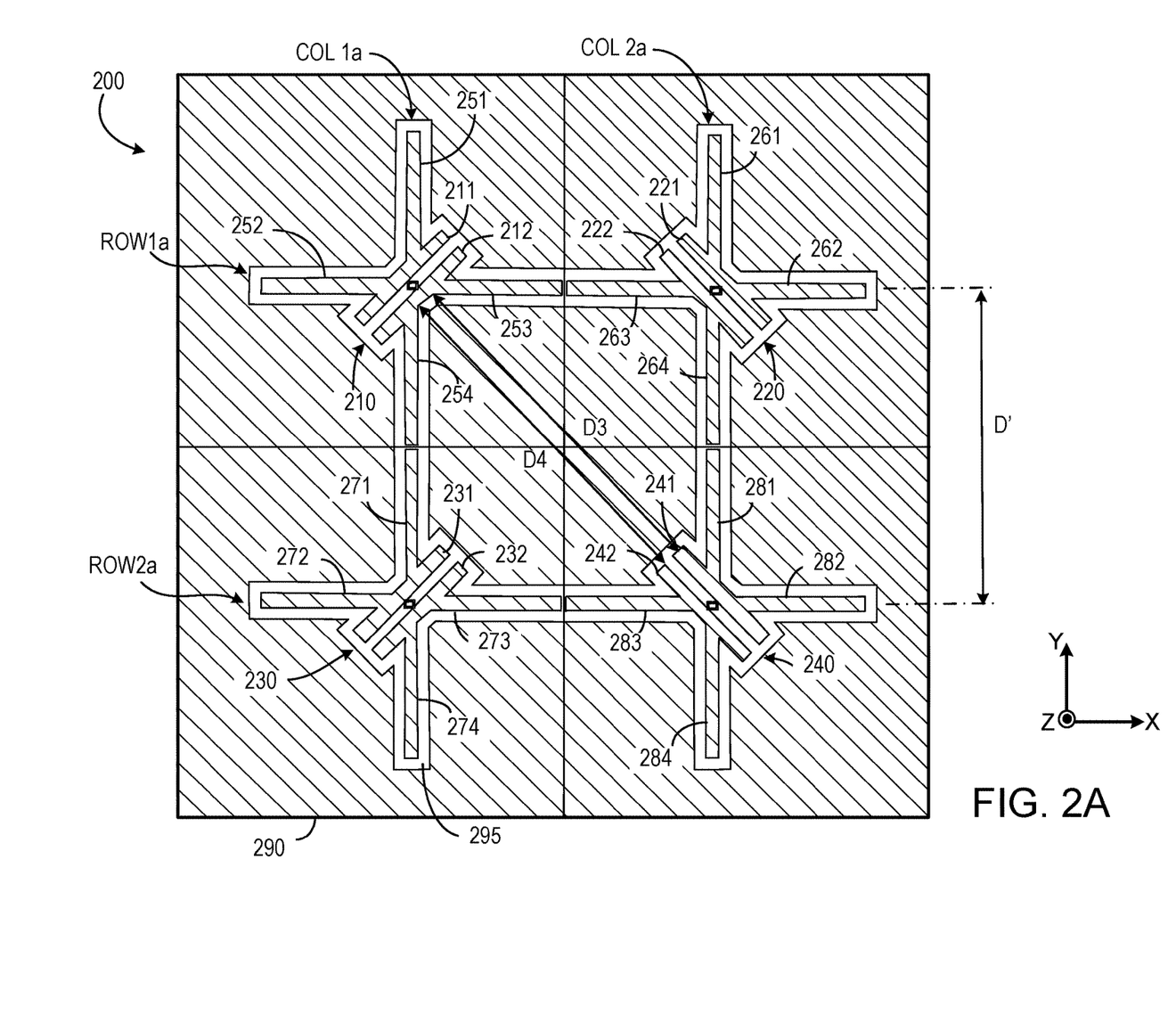
FIG. 2A is a diagram illustrating another example array of qubits for a qubit system.

To reduce the parasitic capacitance, the orientation of the next nearest neighbor qubit may be modified so that there is little or no difference in charge between the electrodes of the next nearest neighbor qubit. Since the capacitive coupling scales with the difference in charge, reducing this difference may be relied on to reduce the amount of parasitic coupling. FIG. 2A illustrates one example of an array where the orientation of the next nearest neighbor qubit is modified.

FIG. 2A illustrates an example array 200 of qubits for a qubit system that may be used to reduce parasitic coupling to undesired qubits. The array 200 in FIG. 2A is the same as or similar to the array 100 in FIG. 1A except the following differences. The array 200 includes multiple qubits, e.g., qubits 210-240, that are arranged in multiple rows, e.g., a first row ROW1a and a second row ROW2a, and multiple columns, e.g., a first column COL1a and a second column COL2a. The qubits 210-240 are differential qubits. As such, none of the nodes of the qubits 210-240 shares a common ground with another node of any of the qubits. The numbers of qubits, rows, and columns are not limited to the numbers illustrated in FIG. 2A. The array 200 can include any suitable numbers of qubits, rows, and columns in various implementations. Each qubit of the qubits 210-240 shown in FIG. 2A is referred to as a "differential Xmon qubit." However, the qubits 210-240 can be any suitable types of qubits including Xmon qubits, transmon qubits, fluxmon qubits, flux qubits, gatemon qubits, gmon qubits, phase qubits, and spin qubits. In particular, the qubits 210-240 can be any types of qubits where parasitic coupling can occur between two of those qubits.

Similar to the array in FIG. 1A, each qubit of the qubits 210-240 includes two electrodes arranged in parallel. For example, the first qubit 210 can include a first electrode 211 and a second electrode 212, the second qubit 220 can include a first electrode 221 and a second electrode 222, the third qubit 230 can include a first electrode 231 and a second electrode 232, and the fourth qubit 240 can include a first electrode 241 and a second electrode 242. In this implementation, the second qubit 220 or the third qubit 230 may be identified as the "nearest neighbor" qubit of the first qubit 210. The fourth qubit 240 that is diagonally located from the first qubit 210 may be identified as the "next nearest neighbor" qubit of the first qubit 210. As another example, the first qubit 210 or the fourth qubit 240 may be identified as the "nearest neighbor" qubit of the second qubit 220. The third qubit 230 that is diagonally located from the second qubit 220 may be identified as the "next nearest neighbor" qubit of the second qubit 220. Similar to the array in FIG. 1A, each of the qubits 210-240 also includes four co-planar waveguide arms (251-254, 261-264, 271-274, and 281-284).

Figure 2B:
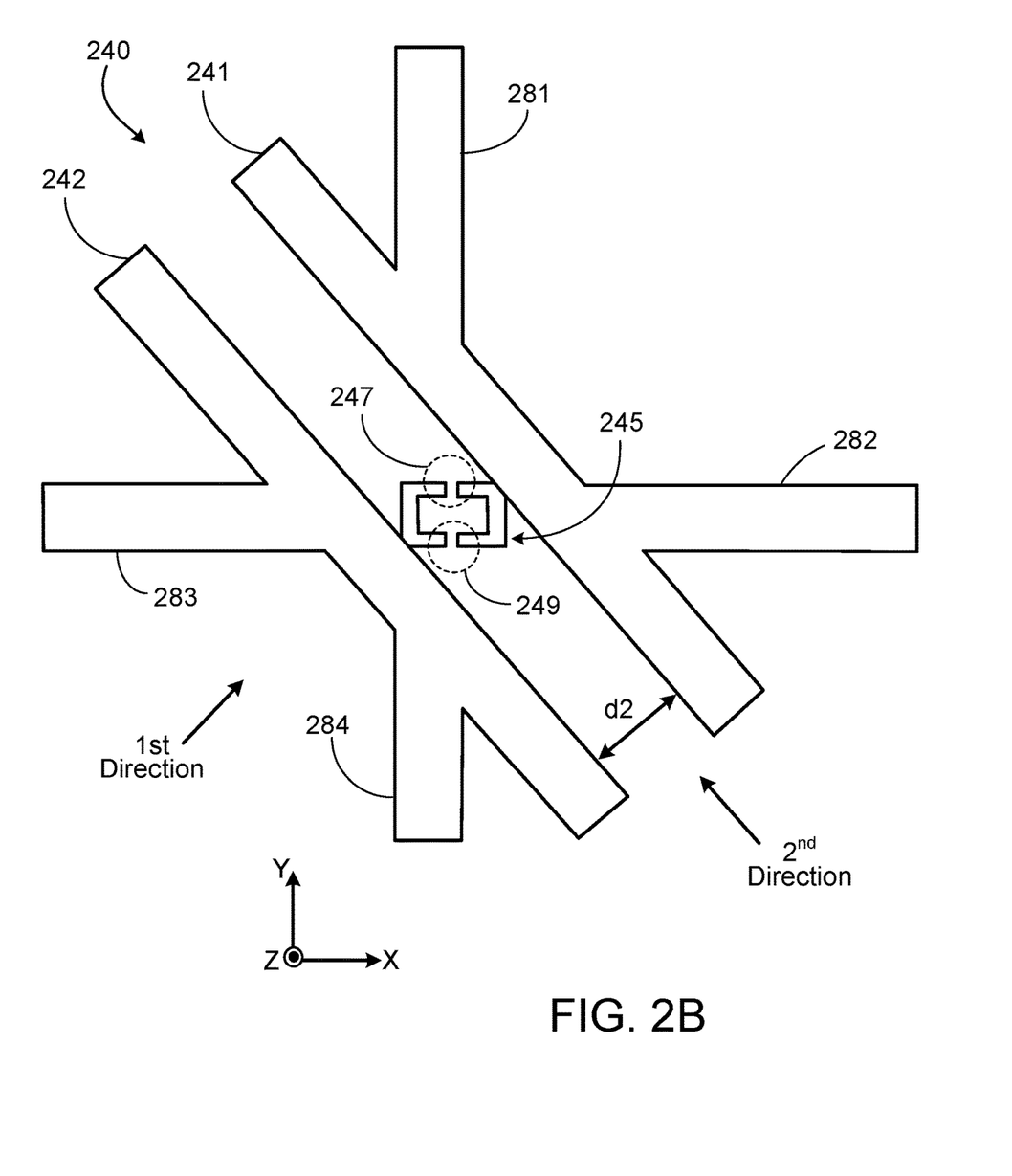
FIG. 2B is a diagram illustrating an example of a SQUID of a qubit in the array described with reference to FIG. 2A.

FIG. 2B illustrates a SQUID 245 of a qubit 240 in the array 200 described with reference to FIG. 2A. For example, the fourth qubit 240 includes a SQUID 245 that is located between the first electrode 241 and the second electrode 242. The SQUID 245 includes a first junction 247 and a second junction 249. Each of the first junction 247 and the second junction 249 is coupled to both the first electrode 241 and the second electrode 242. In some implementations, the junctions 247, 249 can be Josephson junctions. Referring again to FIG. 2A, the electrodes and co-planar waveguide of the qubits 210-240 are separated from a ground plane 290 by gaps 295. The electrodes, ground planes, and co-planar waveguide arms shown in FIG. 2A may be formed from superconductor thin films, such as aluminum, niobium, or titanium nitride, among other superconductors. The qubits 210-240 and ground planes 290 in FIG. 2A are formed on a dielectric substrate such as, e.g., silicon or sapphire.

In some implementations, the qubits are located in a different plane from a ground plane. For example, where multiple qubits and multiple co-planar waveguide arms are located in a qubit plane, the ground plane can be formed in parallel to the qubit plane. In this implementation, the ground plane can be coupled to the qubit plane through interconnectors, e.g., superconducting interconnectors.

In implementation shown in FIG. 2A, electrodes of two diagonally-located qubits are arranged in perpendicular directions. For example, the electrodes 211, 212 of the first qubit 210 are arranged in a first direction and the electrodes 241, 242 of the fourth qubit 240 that is a diagonally-located qubit of the first qubit 210 are arranged in a second direction that is perpendicular to the first direction such that the distance D3 between the second electrode 212 and the first electrode 241 is the same as the distance D4 between the second electrode 212 and the second electrode 242. However, the perpendicular relationship between the first direction and the second direction is only one example of the relationship and the electrodes 211, 212 of the first qubit 210 can be arranged in any suitable direction relative to the electrodes 241, 242 of the fourth qubit 240 as long as the distance D3 is the same as the distance D4. However, the specific geometry of the qubit array is not limited to those shown in FIG. 1A or 2A. The concept of suppressing parasitic capacitive coupling between two qubits apply to any arrangement of qubits, especially if they are in a two-dimensional substrate. In general, for any "differential design" of a qubit array, if any of the two qubits of the qubit array are arranged such that a charge present on an electrode of a first qubit induces the same charge on each of a first electrode and a second electrode of the capacitive element of a second qubit, the parasitic capacitive coupling between the two qubits can be minimized. These can be achieved by adjusting one or more of respective shapes, the relative distance, and/or the relative angle of the electrodes belonging to the first qubit and the second qubit. The shape of the qubit array may not be limited to a square grid and the two qubits between which the parasitic capacitive coupling is to be minimized may not be limited to the next nearest neighbors to each other in the qubit array. Furthermore, the qubits of the array need not be arranged in rows and columns but can be in almost any arrangement. For instance, the qubits could be arranged in a regular hexagonal grid. They could alternatively be arranged in an irregular grid of some form.

In some implementations, to prevent the undesired parasitic coupling between the first qubit 210 and the fourth qubit 240, the qubits 210-240 are not coupled to the same common ground. That is, electrodes of each qubit of the qubits 210-240 are coupled to different nodes that have respective potential values. For example, the second electrode 212 is coupled to a first node that has a first potential value and the second electrode of the fourth 242 of the fourth qubit 240 is coupled to a second node rather than the second electrode 212 and the second electrode 242 being coupled to the common ground. In some implementations, as described above, two electrodes of one qubit may be floating. That is, different AC voltages can be respectively applied to two electrodes of one qubit. If different AC voltages are respectively applied to the two electrodes of one qubit, different charges are induced in the two electrodes. This charge difference can be coupled to the differential mode of the qubit. That is, charges induced in an electrode of one qubit can induce charges in electrodes of other qubits. For example, charges in the first electrode 211 of the first qubit 210 can induce charges in the first electrode 221 of the second qubit 220 or in the first electrode 241 of the fourth qubit 240.

During operation of a quantum computational system employing the qubit array 200, due to proximity, charge present in one qubit may lead to charge induced in another qubit to which coupling is not desired. For example, charge present in the qubit 210 may lead to an induced charge in a next nearest neighbor qubit on the array diagonals, such as the qubit 240. However, due to the modified positioning and arrangement of the electrodes within the qubit 240 relative to the qubit 210, parasitic coupling between the qubit 210 and the qubit 240 may be reduced and even effectively nulled.

Figure 2C:
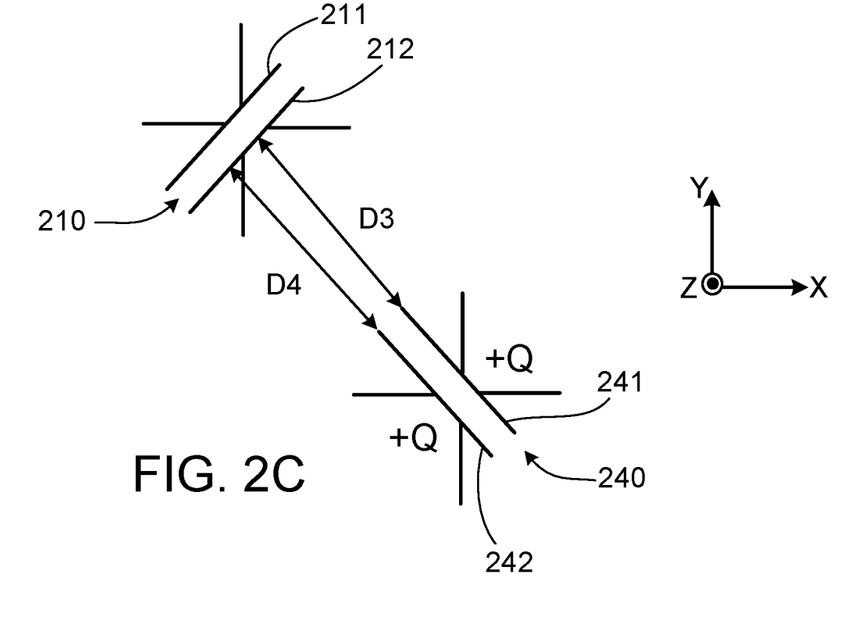
FIG. 2C is a schematic illustrating parasitic capacitive coupling between on-diagonal qubits described with reference to FIG. 2A.

FIG. 2C is a schematic illustrating parasitic capacitive coupling between on-diagonal qubits within an array, such as the qubit 210 and the qubit 240 of FIG. 2A. Because the qubits are not operating in a common ground configuration, where, e.g., one electrode from each qubit is tied to the same ground potential, a same magnitude of charge (+Q) is induced in both the first electrode 241 and in the second electrode 242 of the fourth qubit 240 when a charge is provided to the electrode 212 of the first qubit 210. An identical charge is induced in the electrodes 241, 242 because both of the electrodes 241, 242 are positioned at a same distance (D4=D3) from the electrode 212 and are arranged to have the same orientation relative to the electrode 212. Likewise, a charge in the first electrode 211 will induce equal charges in the electrodes 241 and 242. Given that the coupling between a first qubit (e.g., qubit 210) and a second qubit (e.g., 240) scales with the charge difference between the induced charges on each of the electrodes within the second qubit, the parasitic capacitance between qubit 210 and qubit 240 is reduced or effectively nulled when the induced charges are the same magnitude and sign. Hence, the differential mode of the first qubit 210 does not couple to the differential mode of the fourth qubit 240. In some implementations, the modified array of qubits shown in FIG. 2A may lead to a reduction in parasitic capacitance between qubits by about 98% compared to the array of qubits shown in FIG. 1A. For example, where a distance D' between one qubit and its nearest qubit is 600 μm, the parasitic capacitance between the first qubit 210 and the fourth qubit 240 can be 0.33 aF. For the same or similar reasons, parasitic coupling between the second qubit 220 and the third qubit 230 can be reduced or effectively nulled. For example, the parasitic capacitance between the second qubit 220 and the third qubit 230 can be 0.25 aF.

In quantum algorithms, these unwanted parasitic couplings lead to increased error rates in other adjacent qubits. In particular, the parasitic capacitive coupling manifests itself as a state-dependent frequency shift of the affected qubits, which leads to phase error in gate operations. The corresponding error on a single qubit due to this interaction, so called ZZ error value, increases during the duration of each gate operation. Therefore, comparing to the array 100, the array 200 has a lower ZZ error value. For example, where CouplingStrength represents the coupling strength between two diagonally-located qubits, A represents the detuning between two diagonally-located qubits, and, η represents the nonlinearity, the ZZ Interaction can be expressed as:

$$ZZInteraction = (CouplingStrength)^2 \frac{\eta_1 + \eta_2}{(\Delta - \eta_1) \times (\Delta + \eta_2)}$$

Where t represents the time, the ZZ Error can be expressed as:

$$ZZError = \frac{1}{24} \times (ZZInteraction \times t)^2$$

For example, comparing to the ZZ Error of the array 100, the ZZ Error of the array 200 can be reduced by about 99%.

Although the array 200 reduces or effectively nulls the parasitic capacitance between diagonally-located qubits, the array 200 does not change the coupling capacitance between one qubit and its nearest neighbor qubit comparing to the array 100. For example, Table 1 shows the coupling capacitance between one qubit and its nearest qubit for the array 100 described with reference to FIG. 1A and Table 2 shows the coupling capacitance between one qubit and its nearest qubit for the array 200 described with reference to FIG. 2A.

TABLE 1

| Qubit-Nearest Qubit | Coupling Capacitance (fF) |
| --- | --- |
| First Qubit 110-Second Qubit 120 | 0.573 |
| Second Qubit 120-Third Qubit 130 | 0.562 |
| Third Qubit 130-Fourth Qubit 140 | 0.566 |
| Fourth Qubit 140-First Qubit 110 | 0.571 |

TABLE 2

| Qubit-Nearest Qubit | Coupling Capacitance (fF) |
| --- | --- |
| First Qubit 210-Second Qubit 220 | 0.578 |
| Second Qubit 220-Third Qubit 230 | 0.574 |
| Third Qubit 230-Fourth Qubit 240 | 0.569 |
| Fourth Qubit 240-First Qubit 210 | 0.570 |

Table 1 and Table 2 show that the array 200 does not change the coupling capacitance between one qubit and its nearest qubit comparing to the array 100. Since the coupling strength corresponds to coupling capacitance, the array 200 does not change coupling strength between one qubit and its nearest qubit comparing to the array 100. For example, where the first qubit is tuned to a frequency between 1-20 GHz, the coupling strength between the first qubit 210 and the second qubit 220 that is located the nearest from the first qubit 210 can be between 0-30 MHz and the coupling strength between the first qubit 210 and the fourth qubit 240 that is diagonally located from the first qubit 210 can be between 0-0.01 MHz. For example, a coupling capacitance of 0.57 fF equals roughly to a coupling strength of 10 MHz at an operating frequency of 5 GHz.

In some implementations, to fabricate a qubit, such as the qubits in array 100 or array 200, multiple layers may be required to form the SQUID junctions. For example, a first layer of superconductor material may be deposited for form a first contact of the junctions, followed by oxidation in select regions to form the junction insulator, and then a second layer of superconductor material may be deposited to form the second contact of the junction. To maintain low loss surfaces, the foregoing deposition and oxidation process is typically performed without breaking vacuum. The condition that vacuum may not be broken therefore may require patterning and application of a single mask to define the features of the qubit prior to deposition and oxidation. To avoid forming the first superconductor layer and the second superconductor layer in a single deposition step, however, an angled shadow deposition process may be used. In an angled shadow deposition process, a first superconductor layer is deposited by exposing the substrate and patterned mask to a first flux of superconductor material (e.g., using physical vapor deposition) at an oblique angle relative to the substrate surface. Portions of the mask may be relied on to block (i.e., effectively act as a shadow mask) deposition of the superconductor in regions where the second superconductor layer is to be performed. Following oxidation, the substrate is rotated (e.g., 90 degrees) and a second superconductor layer is deposited by exposing the device and patterned mask to a second flux of superconductor material again at an oblique angle relative to the substrate surface. Portions of the mask again may be relied on to block deposition of the superconductor material, but this time from being deposited in regions where the first superconductor layer has been formed. An advantage of the subject matter of the present disclosure is that even though the arrangement of the on-diagonal qubits are modified relative to one another, the angled shadow deposition process still may be used. That is, there is no need to change any steps of the qubit fabrication process other than the mask design. Thus, a substantial reduction in parasitic capacitance may be achieved with no increased fabrication cost.

Implementations of the quantum subject matter and quantum operations described in this specification can be implemented in suitable quantum circuitry or, more generally, quantum computational systems, including the structures disclosed in this specification and their structural equivalents, or in combinations of one or more of them. The term "quantum computational systems" may include, but is not limited to, quantum computers, quantum information processing systems, quantum cryptography systems, topological quantum computers, or quantum simulators.

The terms quantum information and quantum data refer to information or data that is carried by, held or stored in quantum systems, where the smallest non-trivial system is a qubit, e.g., a system that defines the unit of quantum information. It is understood that the term "qubit" encompasses all quantum systems that may be described exactly or suitably approximated as a two-level system in the corresponding context. Such quantum systems may include multi-level systems, e.g., with two or more levels. By way of example, such systems can include atoms, electrons, photons, trapped or un-trapped ions, atomic nuclei, color centers, topological qubits, quantum dots, Bose-Einstein condensates, or superconducting qubits. In some implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Quantum circuit elements (also referred to as quantum computing circuit elements) include circuit elements for performing quantum processing operations. That is, the quantum circuit elements are configured to make use of quantum-mechanical phenomena, such as superposition and entanglement, to perform operations on data in a non-deterministic manner. Certain quantum circuit elements, such as qubits, can be configured to represent and operate on information in more than one state simultaneously. Examples of superconducting quantum circuit elements include circuit elements such as quantum LC oscillators, qubits (e.g., flux qubits, phase qubits, or charge qubits), and superconducting quantum interference devices (SQUIDs) (e.g., RF-SQUID or DC-SQUID), among others.

In contrast, classical circuit elements generally process data in a deterministic manner. Classical circuit elements can be configured to collectively carry out instructions of a computer program by performing basic arithmetical, logical, and/or input/output operations on data, in which the data is represented in analog or digital form. In some implementations, classical circuit elements can be used to transmit data to and/or receive data from the quantum circuit elements through electrical or electromagnetic connections. Examples of classical circuit elements include circuit elements based on CMOS circuitry, rapid single flux quantum (RSFQ) devices, reciprocal quantum logic (RQL) devices and ERSFQ devices, which are an energy-efficient version of RSFQ that does not use bias resistors.

Fabrication of the circuit elements described herein can entail the deposition of one or more materials, such as superconductors, dielectrics and/or metals. Depending on the selected material, these materials can be deposited using deposition processes such as chemical vapor deposition, physical vapor deposition (e.g., evaporation or sputtering), or epitaxial techniques, among other deposition processes. Processes for fabricating circuit elements described herein can entail the removal of one or more materials from a device during fabrication. Depending on the material to be removed, the removal process can include, e.g., wet etching techniques, dry etching techniques, or lift-off processes. The materials forming the circuit elements described herein can be patterned using known lithographic techniques (e.g., photolithography or e-beam lithography).

During operation of a quantum computational system that uses superconducting quantum circuit elements and/or superconducting classical circuit elements, such as the circuit elements described herein, the superconducting circuit elements are cooled down within a cryostat to temperatures that allow a superconductor material to exhibit superconducting properties. A superconductor (alternatively superconducting) material can be understood as material that exhibits superconducting properties at or below a superconducting critical temperature. Examples of superconducting material include aluminum (superconductive critical temperature of 1.2 kelvin) and niobium (superconducting critical temperature of 9.3 kelvin). Accordingly, superconducting structures, such as superconducting traces and superconducting ground planes, are formed from material that exhibits superconducting properties at or below a superconducting critical temperature.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Moreover, the separation of various components in the implementations described above should not be understood as requiring such separation in all implementations.

A number of implementations have been described. Nevertheless, it will be understood that various modifications may be made without departing from the spirit and scope of the invention. For instance, various examples are described herein using Purcell filters. However, other filters, such as low pass filters, high pass filters, stepped impedance filters, among other types of filters may be used instead. Other implementations are within the scope of the following claims.

What is claimed is:

1. A system comprising an array of qubits, wherein the array of qubits comprises:
    a first qubit comprising two electrodes; and
    a second qubit comprising two electrodes, and
    wherein a distance between a first electrode of the first qubit and a first electrode of the second qubit is the same as a distance between the first electrode of the first qubit and a second electrode of the second qubit.

2. The system of claim 1, wherein the first electrode of the first qubit does not share a common ground with the first electrode and the second electrode of the second qubit.

3. The system of claim 1, wherein a first AC potential is applied to the first electrode of the first qubit and a second AC potential, which is different from the first AC potential, is applied to the second electrode of the first qubit.

4. The system of claim 1, wherein the first electrode of the first qubit is coupled to the second electrode of the first qubit through a Josephson junction.

5. The system claim 1, wherein the first electrode of the first qubit and the second electrode of the first qubit are elongated along a first direction, and wherein the first electrode of the second qubit and the second electrode of the second qubit are elongated along a second direction that is different from the first direction.

6. The system of claim 5, wherein the first direction is orthogonal to the second direction.

7. The system of claim 1, wherein the second qubit is a next nearest neighbor of the first qubit.

8. The system of claim 1, wherein the first qubit is a differential qubit.

9. The system of claim 8, wherein the first qubit is an Xmon qubit.

10. The system of claim 1, wherein the array of qubits is a 2D array of qubits comprising a plurality of rows of qubits and a plurality of columns of qubit.

11. The system of claim 1, wherein the array of qubits is an irregular grid.

12. The system of claim 1, wherein the first qubit comprises a plurality of co-planar waveguide arms, wherein at least one co-planar waveguide arm extends outwardly from each electrode of the first qubit.

13. The system of claim 12, comprising a third qubit, wherein the third qubit is a nearest neighbor qubit of the first qubit, and wherein the third qubit comprises two electrodes.

14. The system of claim 13,
    wherein the third qubit comprises a plurality of co-planar waveguide arms, wherein at least one co-planar waveguide arm extends outwardly from each electrode of the third qubit, and
    wherein an end of a co-planar waveguide arm of the first qubit faces an end of a co-planar waveguide arm of the third qubit.

15. The system of claim 1, wherein a coupling strength between the first qubit and the second qubit is more than 0 MHz and less than 0.01 MHz for the first qubit tuned to a frequency between about 1 GHz and about 20 GHz.

16. The system of claim 1, wherein a coupling strength between the first qubit and an additional qubit that is a nearest neighbor to the first qubit is more than 0 MHz and less than 30 MHz for the first qubit tuned to a frequency between about 1 GHz and about 20 GHz.

17. The system of claim 1, further comprising a ground plane surrounding the first qubit and the second qubit.

18. The system of claim 1, further comprising a ground plane, wherein the ground plane is a different plane from a qubit plane in which qubits of the array of qubits are located.

* * * * *